US012693597B2

(12) United States Patent　(10) Patent No.:　US 12,693,597 B2
Xu et al.　(45) Date of Patent:　Jul. 28, 2026

(54) LITHOGRAPHY STITCHING

(71) Applicant: Applied Materials, Inc., Santa Clara, CA (US)

(72) Inventors: Yongan Xu, Santa Clara, CA (US); William Wilkinson, Fremont, CA (US); Jing Guo, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 742 days.

(21) Appl. No.: 18/131,737

(22) Filed: Apr. 6, 2023

(65) Prior Publication Data

US 2023/0324805 A1　Oct. 12, 2023

Related U.S. Application Data

(60) Provisional application No. 63/330,182, filed on Apr. 12, 2022.

(51) Int. Cl.
　　*G03F 7/20*　　(2006.01)
　　*G03F 7/00*　　(2006.01)
(52) U.S. Cl.
　　CPC .......... *G03F 7/203* (2013.01); *G03F 7/70475* (2013.01)
(58) Field of Classification Search
　　CPC ........................... G03F 7/203; G03F 7/70475
　　See application file for complete search history.

(56) References Cited

U.S. PATENT DOCUMENTS

| | | | |
|---|---|---|---|
| 5,795,686 A | | 8/1998 | Takizawa et al. |
| 5,998,068 A | * | 12/1999 | Matsuoka ................. G03F 1/50 |
| | | | 430/394 |
| 6,150,840 A | | 11/2000 | Patel et al. |
| 7,133,121 B2 | | 11/2006 | Bleeker et al. |

(Continued)

FOREIGN PATENT DOCUMENTS

| | | |
|---|---|---|
| JP | 3482976 B2 | 1/2004 |
| KR | 10-2015-0114371 A | 10/2015 |
| WO | 00/67302 A1 | 11/2000 |

OTHER PUBLICATIONS

International Search Report dated Jul. 20, 2023 for Application No. PCT/US2023/017776.

(Continued)

*Primary Examiner* — Jonathan Johnson
*Assistant Examiner* — Alexander N. Lee
(74) *Attorney, Agent, or Firm* — Patterson + Sheridan, LLP

(57)　　　　ABSTRACT

A method of forming patterned features on a substrate is provided. The method includes: positioning a first mask over a first portion of a substrate; directing radiation through the patterned area of the first mask at the first portion of the substrate to form a first patterned region on the substrate; positioning a second mask over a second portion of the substrate, the second mask including a first patterned area and a second patterned area, the first patterned area spaced apart from the second patterned area by an unpatterned area; directing radiation through the first patterned area of the second mask at a first part of the second portion of the substrate to form a second patterned region on the substrate; and directing radiation through the second patterned area of the second mask at a second part of the second portion of the substrate to form a third patterned region.

20 Claims, 6 Drawing Sheets

(56)        References Cited

U.S. PATENT DOCUMENTS

| | | | |
|---|---|---|---|
| 7,707,535 B2 | 4/2010 | Dunham et al. | |
| 7,879,514 B2 | 2/2011 | Phillipps et al. | |
| 7,987,057 B1 | 7/2011 | DiBiase | |
| 9,087,740 B2 | 7/2015 | Ausschnitt et al. | |
| 2005/0170267 A1* | 8/2005 | Bleeker | G03F 7/70466 |
| | | | 430/30 |
| 2008/0094595 A1 | 4/2008 | Bleeker et al. | |
| 2017/0213798 A1 | 7/2017 | Wei et al. | |
| 2019/0164899 A1* | 5/2019 | Hu | H10W 46/00 |
| 2021/0223704 A1* | 7/2021 | Xu | G03F 7/70475 |
| 2021/0313292 A1 | 10/2021 | Wang et al. | |

OTHER PUBLICATIONS

Extended European Search Report for Application No. 23788782.3 dated Apr. 10, 2026.

* cited by examiner

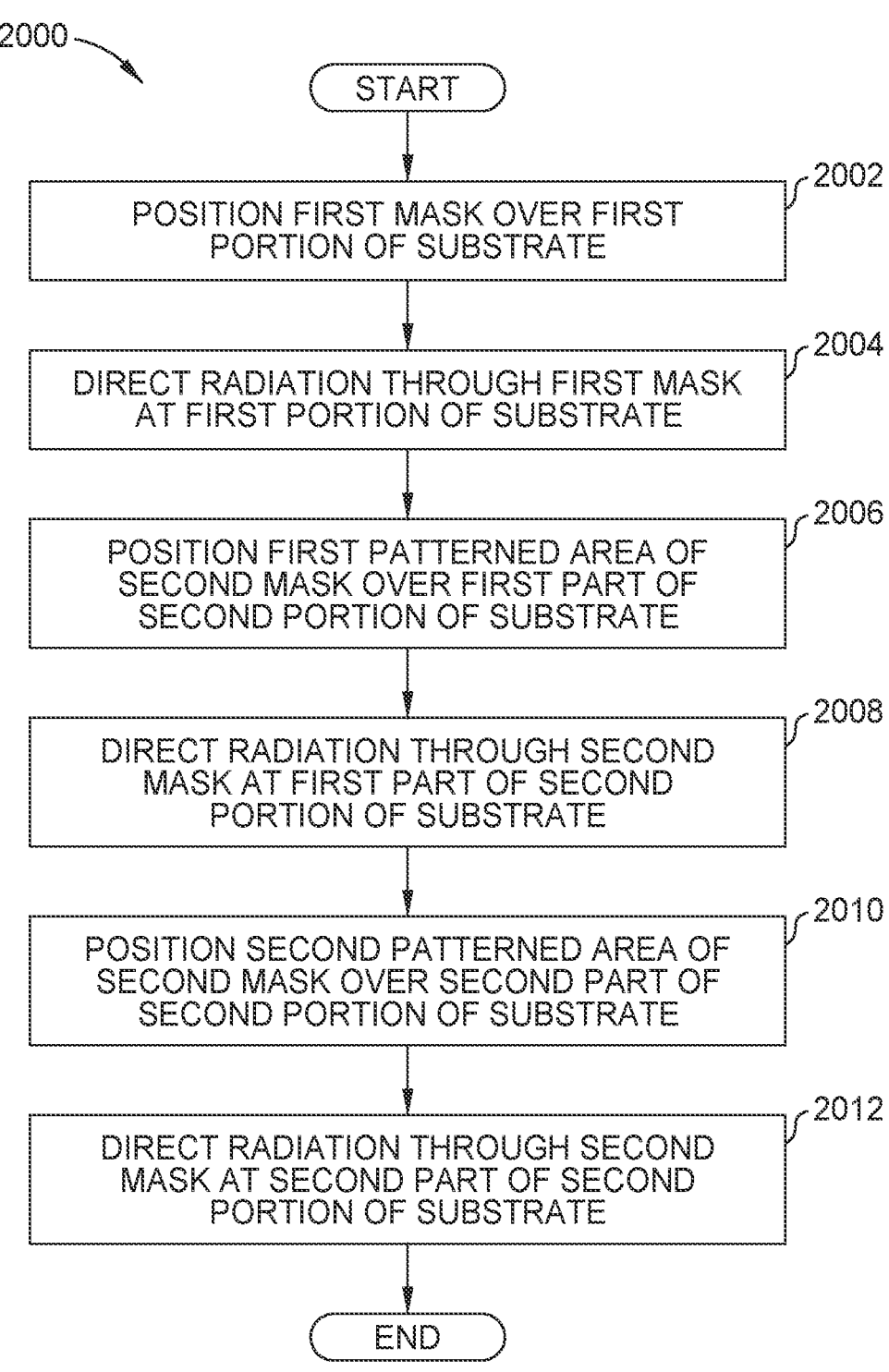

2000

START

POSITION FIRST MASK OVER FIRST PORTION OF SUBSTRATE
2002

DIRECT RADIATION THROUGH FIRST MASK AT FIRST PORTION OF SUBSTRATE
2004

POSITION FIRST PATTERNED AREA OF SECOND MASK OVER FIRST PART OF SECOND PORTION OF SUBSTRATE
2006

DIRECT RADIATION THROUGH SECOND MASK AT FIRST PART OF SECOND PORTION OF SUBSTRATE
2008

POSITION SECOND PATTERNED AREA OF SECOND MASK OVER SECOND PART OF SECOND PORTION OF SUBSTRATE
2010

DIRECT RADIATION THROUGH SECOND MASK AT SECOND PART OF SECOND PORTION OF SUBSTRATE
2012

END

FIG. 2

LITHOGRAPHY STITCHING

CROSS-REFERENCE TO RELATED APPLICATIONS

This application claims priority to U.S. Provisional Patent Application Ser. No. 63/330,182, filed on Apr. 12, 2022, which herein is incorporated by reference.

BACKGROUND

Field

Embodiments of the present disclosure generally relate to methods of forming patterns on substrates, for example using masks to transfer patterns to substrates. More specifically, embodiments of the present disclosure relate to improvements in lithography stitching.

Description of the Related Art

Transferring patterns to substrates, such as semiconductor substrates, is often accomplished using masks. For example, photolithography can be used to transfer patterns in the masks to a photoresist disposed on the substrate. The patterns to be formed on the substrate correspond to the patterns on the mask. Ideally, no pattern feature (e.g., a line in a pattern) on the substrate is formed with more than one mask, but due to the size of the patterns to be formed on larger substrates and/or the size of the equipment being used, more than one mask is often used to form a particular patterned feature on a substrate.

In situations where two masks are used to form a single patterned feature on a substrate, alignment of the two masks over the substrate is beneficial, so that the portion of the patterned feature generated using the first mask lines up with the portion of the patterned feature generated using the second mask. Despite efforts to make the transition between the first mask and the second mask seamless, problems remain. For example, the portions of patterned features corresponding to the seam between the masks often receive too much or too little radiation causing the regions of the patterned features corresponding to the seam between the masks to have larger or smaller dimensions than intended. These variations in the dimensions of the patterned features can often be significant enough to affect the performance of the device (e.g., a waveguide combiner for an augmented reality application) ultimately generated from the patterned features.

Therefore, there is a need for methods and corresponding equipment for improved lithography processing.

SUMMARY

Embodiments of the present disclosure generally relate to methods of forming patterns in substrates, for example using masks to transfer patterns to substrates. In one embodiment, a method of forming patterned features on a substrate is provided. The method includes: positioning a first mask over a first portion of a substrate, the first mask including a patterned area; directing radiation through the patterned area of the first mask at the first portion of the substrate to form a first patterned region on the substrate during a first time period; positioning a second mask over a second portion of the substrate, the second mask including a first patterned area and a second patterned area, the first patterned area spaced apart from the second patterned area by an unpatterned area; directing radiation through the first patterned area of the second mask at a first part of the second portion of the substrate to form a second patterned region on the substrate during a second time period; and directing radiation through the second patterned area of the second mask at a second part of the second portion of the substrate to form a third patterned region on the substrate during a third time period, wherein the third patterned region is positioned between the first patterned region and the second patterned region.

In another embodiment, a method of forming patterned features on a substrate is provided. The method includes: positioning a first mask over a first portion of a substrate, the first mask including a patterned area, directing radiation through the patterned area of the first mask at the first portion of the substrate to form a first patterned region on the substrate during a first time period; positioning a second mask over a second portion of the substrate, the second mask including a first patterned area and a second patterned area, the first patterned area spaced apart from the second patterned area by an unpatterned area; directing radiation through the first patterned area of the second mask at a first part of the second portion of the substrate to form a second patterned region on the substrate during a second time period; and directing radiation through the second patterned area of the second mask at a second part of the second portion of the substrate to form a third patterned region on the substrate during a third time period, wherein the third patterned region is positioned between the first patterned region and the second patterned region, a size of the third patterned region is less than 1% of a size of the second patterned region, the third patterned region borders the first patterned region, and the third patterned region borders the second patterned region.

In another embodiment, a method of forming patterned features on a substrate is provided. The method includes: positioning a first mask over a first portion of a substrate, the first mask including a patterned area, directing radiation through the patterned area of the first mask at the first portion of the substrate to form a first patterned region on the substrate during a first time period; positioning a second mask over a second portion of the substrate, the second mask including a first patterned area and a second patterned area, the first patterned area spaced apart from the second patterned area by an unpatterned area; directing radiation through the first patterned area of the second mask at a first part of the second portion of the substrate to form a second patterned region on the substrate during a second time period; and directing radiation through the second patterned area of the second mask at a second part of the second portion of the substrate to form a third patterned region on the substrate during a third time period, wherein the third patterned region is positioned between the first patterned region and the second patterned region, wherein a size of the third patterned region is less than 1% of a size of the second patterned region, the third patterned region borders the first patterned region, and the third patterned region borders the second patterned region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

FIG. 2 is a process flow diagram of a method for forming patterned features on the substrate using the masks, according to one embodiment.

Figures 1A, 1B, 1C:
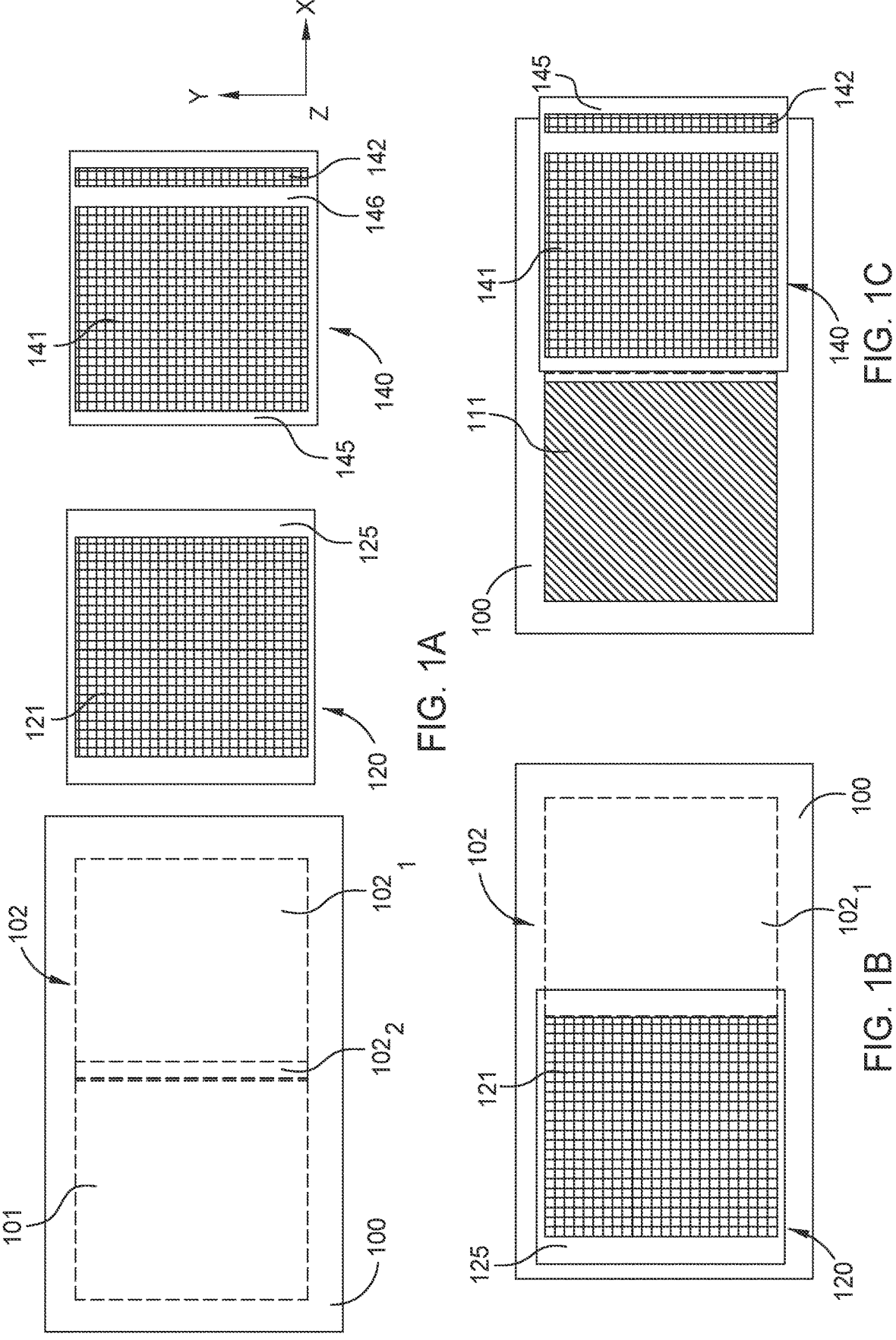
FIG. 1A is a top view of a substrate, a first mask, and a second mask, according to one embodiment.
FIGS. 1B-1F show the substrate and masks from FIG. 1A during different portions of the method shown in FIG. 2 for forming the patterned features on the substrate.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments of the present disclosure generally relate to methods of forming patterns on substrates, for example using two or more masks to transfer patterns to substrates. The improvements from these methods are applicable to any process which use masks or reticles to create patterns on substrates including but not limited to lithography, such as optical lithography or ultraviolet lithography (e.g., extreme UV lithography) as well as lithography using other portions of the electromagnetic spectrum, such as infrared or X-ray.

FIG. 1A is a top view of a substrate 100, a first mask 120, and a second mask 140, according to one embodiment. The substrate 100 can include a layer of photoresist or other material that can be altered by radiation directed at the substrate 100.

The first mask 120 can include a supporting structure 125 (e.g., a frame) and a patterned area 121. The second mask 140 can include a supporting structure 145 (e.g., a frame) a first patterned area 141 and a second patterned area 142. The first patterned area 141 can be spaced apart from the second patterned area 142 by an unpatterned area 146. The patterned areas 121, 141, 142 are shown as having rectangular shapes for ease of illustration, and the patterned areas 121, 141, 142 can have any shape including irregular shapes.

Each of the patterned areas 121, 141, 142 can include one or more two-dimensional arrays (e.g., an array extending in the X and Y directions) of transparent and non-transparent cells to control the patterns of radiation directed at the substrate 100. Radiation can be directed through these patterned areas 121, 141, 142 of the masks 120, 140 to form patterned regions 111, 112, 113 (see e.g., FIG. 1E) on the substrate 100. In one of these embodiments, these patterned regions 111-113 can include patterned features that can be used to form structures for a waveguide combiner that can form part of an augmented reality device.

The substrate 100 includes a first portion 101 and a second portion 102. As described in more detail below, the first mask 120 can be positioned over the first portion 101, and then radiation can be directed at the first portion 101 through the first mask 120. Similarly, the second mask 140 can be positioned over the second portion 102, and then radiation can be directed at the second portion 102 through the second mask 140.

The second portion 102 of the substrate 100 includes a first part 1021 and a second part 1022. The second part 1022 is positioned between the first portion 101 and the first part 1021 of the second portion 102. Radiation can be directed through the first patterned area 141 of the second mask 140 at the first part 1021 of the second portion 102 to form patterned features on the first part 1021 of the second portion 102. Similarly, radiation can be directed through the second patterned area 142 of the second mask 140 at the second part 1022 of the second portion 102 to form patterned features on the second part 1022 of the second portion 102.

FIG. 2 is a process flow diagram of a method 2000 for forming patterned features on the substrate 100 using the masks 120, 140, according to one embodiment. FIGS. 1B-1F show the substrate 100 and masks 120, 140 during different portions of the method 2000 for forming the patterned features on the substrate 100. The method 2000 is described with reference to FIGS. 1A-1F and FIG. 2. The method 2000 begins at block 2002.

At block 2002, the first mask 120 that includes the patterned area 121 is positioned over the first portion 101 of the substrate 100 as shown in FIG. 1B.

At block 2004, during a first time period, radiation (e.g., visible light or ultraviolet light) is directed through the patterned area 121 of the first mask 120 at the first portion 101 of the substrate 100 to form a first patterned region 111 (see FIG. 1C) on the substrate 100.

At block 2006, with reference to FIG. 1C, the first patterned area 141 of the second mask 140 is positioned over the first part 1021 of the second portion 102 of the substrate 100.

At block 2008, radiation is directed through the first patterned area 141 of the second mask 140 at the first part 1021 of the second portion 102 of the substrate 100 to form a second patterned region 112 (see FIG. 1D) on the substrate 100 during a second time period.

Figures 1D, 1E, 1F:
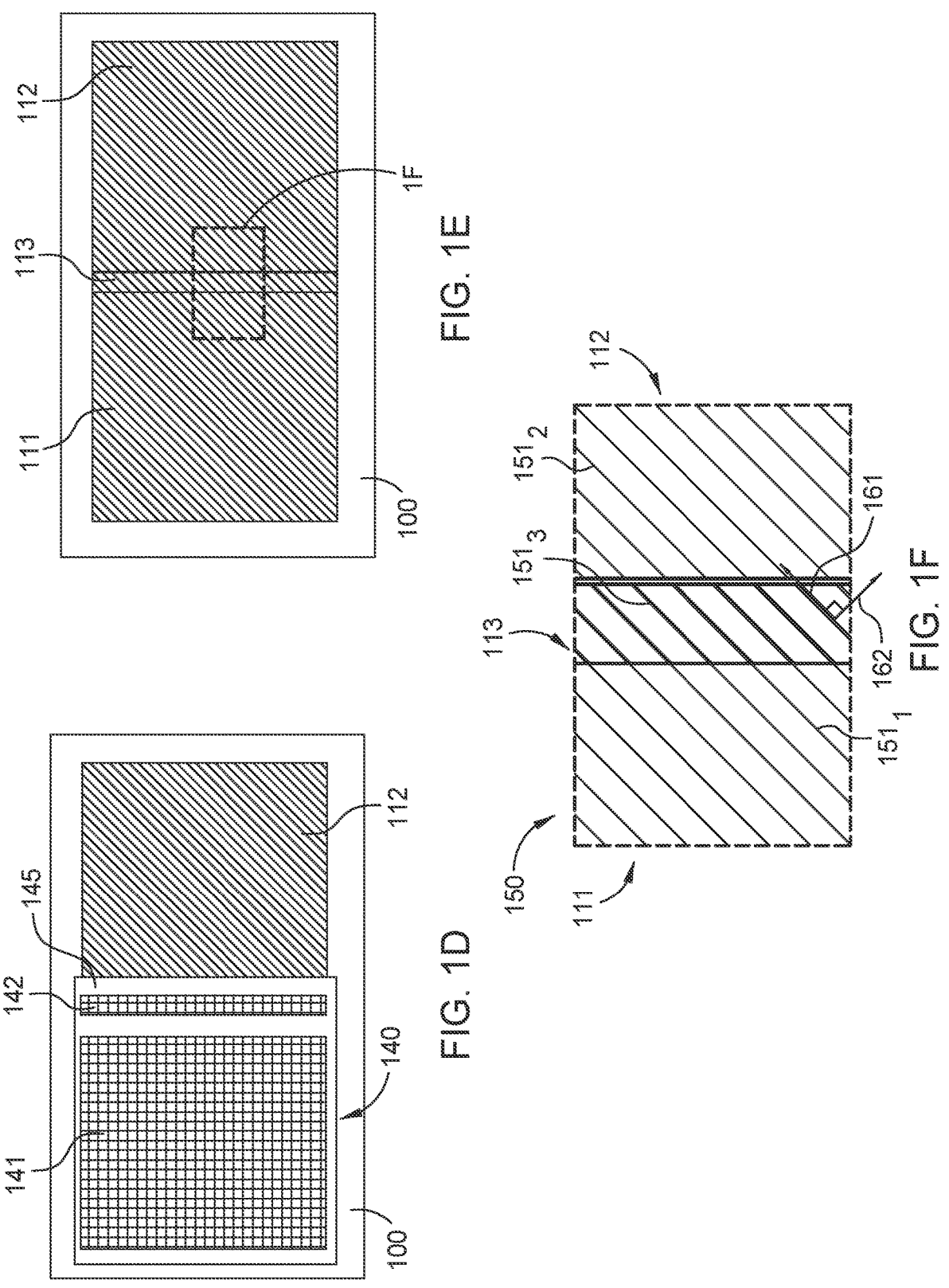

At block 2010, with reference to FIG. 1D, the second patterned area 142 of the second mask 140 is positioned over the second part 1022 of the second portion 102 of the substrate 100.

At block 2012, radiation is directed through the second patterned area 142 of the second mask 140 at the second part 1022 of the second portion 102 of the substrate 100 to form a third patterned region 113 (see FIG. 1E) on the substrate 100 during a third time period.

FIG. 1E shows the first patterned region 111, the second patterned region 112, and the third patterned region 113. FIG. 1F shows a close-up view of section 1F of FIG. 1E. Section 1F of FIG. 1E includes a part of each of the first patterned region 111, the second patterned region 112, and the third patterned region 113. Section 1F shows a pattern 150 that includes patterned features 151 (e.g., lines) that extend through each of the patterned regions 111-113 (although some are cutoff in FIG. 1F). Each patterned feature 151 can include a first portion 1511 positioned in the first patterned region 111, a second portion 1512 positioned in the second patterned region 112, and a third portion 1513 positioned in the third patterned region 113.

The patterned features 151 can include a length extending in a first direction 161 and a width extending in a second direction 162. In some embodiments, the second direction 162 can be perpendicular to the first direction 161. The first direction 161 and the second direction 162 can be in the XY-plane. The patterned features 151 can additionally include a depth in the Z-direction. Often, a goal is to have the width and depth of the patterned features 151 vary as little as possible between each of the patterned regions 111-113, but this can often be difficult to achieve when using more than one mask. Therefore, the goal is generally to reduce these differences as much as possible, so that there is less variance in the width and depth of the patterned features 151 formed by use of the different masks.

As shown in FIG. 1F, the third portions 1513 of the patterned features 151 in the third patterned region 113 have a greater width in the second direction 162 when compared to a width of the portions 1511, 1512 of the patterned features 151 in the first patterned region 111 and the second patterned region 112. Although the third portions 1513 of the patterned features 151 in the third patterned region 113 have a greater width than the portions 1511, 1512 of the patterned features 151 in the first patterned region 111 and the second patterned region 112, use of the second mask 140 with the relatively small second patterned area 142 of the second mask 140 allows for greater control over the radiation applied to areas of the substrate 100 near the border between first portion 101 and the second portion 102. This greater control leads to more uniformity for the width and depth of the patterned features 151 in the patterned regions 111-113, which can improve device performance (e.g., performance of a waveguide combiner) when compared to similar devices having less uniform dimensions between different patterned regions. In some embodiments, greater control for the radiation applied to form the third patterned region 113 is achieved by using (1) radiation with a lower intensity for a longer duration when compared to the radiation used to form the first and second patterned regions 111, 112, or (2) pulsed radiation at a lower duty cycle for a longer duration when compared to pulsed radiation used to form the first and second patterned regions 111, 112. In some embodiments, patterned features 151 in the first and second patterned regions 111, 112 can include different dimensions. For example, in one embodiment, the second portions 1512 of the patterned features 151 in the second patterned region 112 can be wider in the second direction 162 than the first portions 1511 of the patterned features in the first patterned region 111. In such an embodiment, the radiation applied to form the third patterned region 113 can be used to more gradually transition between the two different widths of the first patterned region 111 and the second patterned region 112. For example, in one embodiment, an intensity and/or duration of radiation can gradually increase in the X-direction as radiation is applied to form the third patterned region 113, so that the width of the third portions 1513 of the patterned features 151 in the third patterned region 113 gradually increase in the X-direction.

In some embodiments, the second patterned area 142 is less than 10%, such as less than 1%, such as less than 0.1% of the area of first patterned area 141. For example, in some embodiments, the first patterned area 141 can have a width in the X-direction from about 50 mm to about 1000 mm while the second patterned area 142 can have a width in the X-direction from about 10 micron to about 500 micron. Although the method 2000 is described as forming the first patterned region 111, then the second patterned region 112, and then the third patterned region 113, the method can be performed in any order. For example, in one embodiment, the regions 111-113 are formed in the order as described above in the method 2000 with the first patterned region 111 being formed first, then the second patterned region 112, and then the third patterned region 113. In an alternative embodiment, the third patterned region 113 is formed before the first and second patterned regions 111, 112. In another embodiment, the third patterned region 113 is formed during a time period between the first patterned region 111 and the second patterned region 112.

Figures 3A, 3B, 3C, 3D:
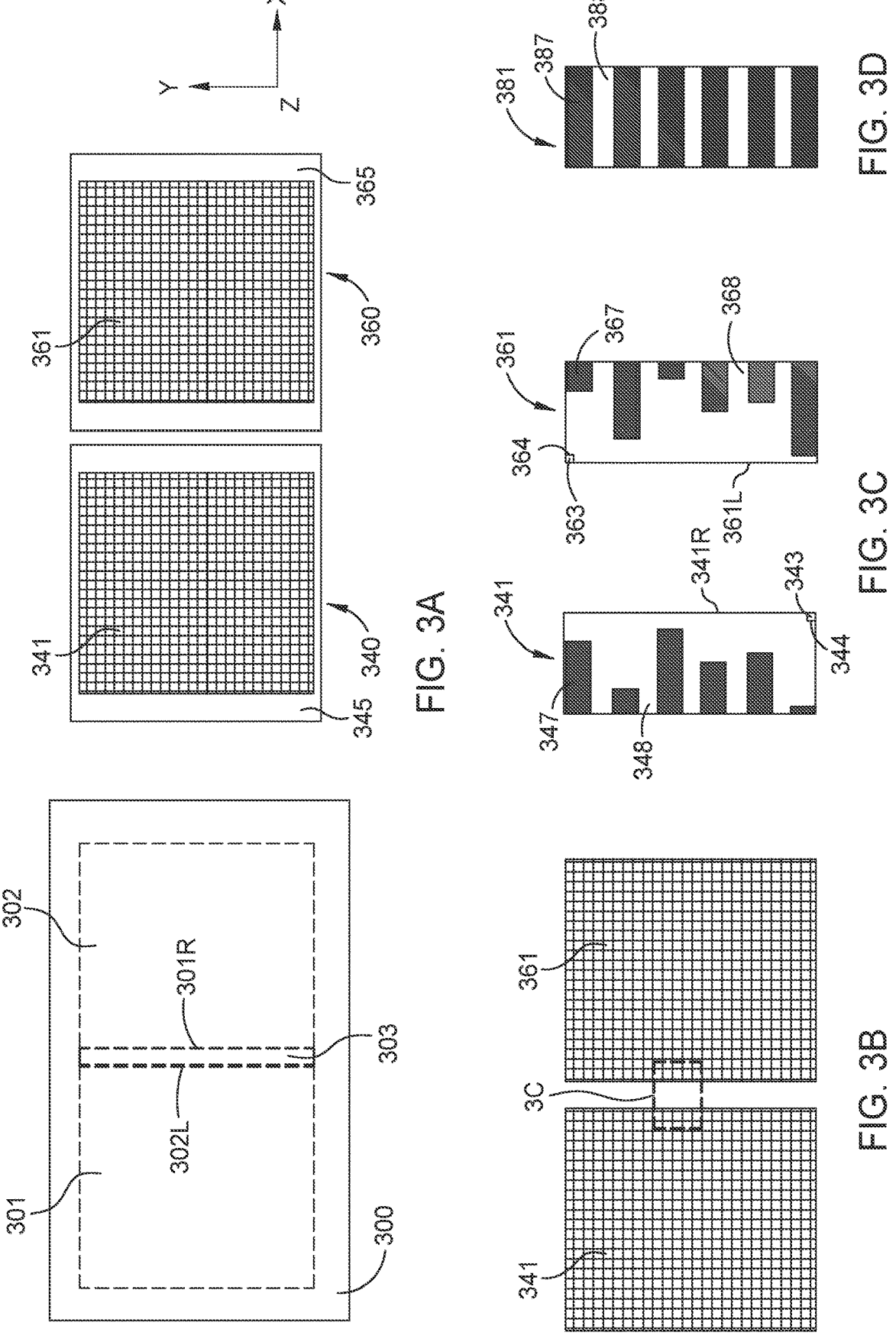
FIG. 3A is a top view of a substrate, a first mask, and a second mask, according to one embodiment.
FIG. 3B shows the patterned areas 341, 361 of the masks from FIG. 3B next to each other without the supporting structures of the masks from FIG. 3B.
FIG. 3C is a close-up view of section 3C from FIG. 3B.
FIG. 3D shows the portions of the patterned areas from FIG. 3C overlaid on top of each other to form a combined patterned area.

FIG. 3A is a top view of a substrate 300, a first mask 340, and a second mask 360, according to one embodiment. The substrate 300 can include a layer of photoresist or other material that can be altered by radiation directed at the substrate 300.

The first mask 340 can include a supporting structure 345 (e.g., a frame) and a patterned area 341. The second mask 360 can include a supporting structure 365 (e.g., a frame) and a patterned area 361. Each of the patterned areas 341, 361 can include one or more two-dimensional arrays (e.g., an array extending in the X and Y directions) of transparent and non-transparent cells to control the patterns of radiation directed at the substrate 300. Radiation can be directed through these patterned areas 341, 361 of the masks 340, 360 to form patterned regions 310, 320, 330 (see e.g., FIG. 3G) on the substrate 300. In one of these embodiments, these patterned regions 310, 320, 330 can include patterned features that can be used to form structures for a waveguide combiner that can form part of an augmented reality device.

The substrate 300 includes a first portion 301 and a second portion 302. As described in more detail below, the first mask 340 can be positioned over the first portion 301, and then radiation can be directed at the first portion 301 through the first mask 340. Similarly, the second mask 360 can be positioned over the second portion 302 and then radiation can be directed at the second portion 302 through the second mask 360. The first portion 301 overlaps with the second portion 302 in an overlap portion 303. For example, a right side 301R of the first portion 301 is shown located inside the second portion 302. Similarly, a left side 302L of the second portion 302 is shown located inside the first portion 301. The area between the right side 301R of the first portion 301 and the left side 302L of the second portion 302 form the overlap portion 303. As described in more detail below, radiation is directed at the overlap portion 303 in a staggered manner complementary manner, which can help reduce the effects of non-uniformity in the features formed using the separate masks 340, 360. The arrangement of transparent cells for the patterned areas 341, 361 can be staggered in the X-direction as shown in FIG. 3C, but these two staggered patterns of transparent cells can be overlaid on top of each other in a complementary manner as shown in FIG. 3D without any overlapping of transparent cells from the two patterned areas 341, 361.

FIG. 3B shows the patterned areas 341, 361 next to each other without the supporting structures 345, 365 of the masks 340, 360 to more easily illustrate how the patterned areas 341, 361 relate to each other. FIG. 3C is a close-up view of section 3C from FIG. 3B. Referring to FIGS. 3B and 3C, the patterned area 341 includes transparent portions 347 and non-transparent portions 348. Similarly, the patterned area 361 includes transparent portions 367 and non-transparent portions 368. The transparent portions 347, 367 can include transparent cells (e.g., square-shaped or rectangular-shaped transparent regions) in the patterned areas 341, 361 of the respective masks 340, 360. The non-transparent portions 348, 368 can include non-transparent cells (e.g., square-shaped or rectangular-shaped transparent regions) in the patterned areas 341, 361 of the of the respective masks 340, 360.

In FIG. 3C portions of the patterned areas 341, 361 corresponding to transparent cells are shown in black while portions of the patterned areas 341, 361 corresponding to non-transparent cells are shown in white. The pattern of transparent cells are shown extending in the X-direction for ease of illustration only, and other patterns (e.g., diagonal patterns or irregular patterns) can also be used.

An exemplary non-transparent cell 343, 363 is shown in the respective patterned areas 341, 361. The non-transparent cells 343, 363 each include a corresponding first side 344, 364. The transparent cells (not shown) can have the same size and shape as the non-transparent cells 343, 363. The transparent cells and non-transparent cells can be arranged in an array of rows and columns to form the transparent portions 347, 367 and non-transparent portions 348, 368 of the respective patterned areas 341, 361. The first side 344 of the unit cells 343 can be parallel to a right edge 341R (also referred to as first edge) of the patterned area 341. Similarly, the first side 364 of the unit cells 363 can be parallel to a left edge 361L (also referred to as first edge) of the patterned area 361. For each patterned area 341, 361 the columns of transparent and non-transparent cells can each individually extend in the Y-direction (i.e., parallel to the edges 341R, 361L) and the columns can be spaced apart from each other in the X-direction. On the other hand, the rows of transparent and non-transparent cells for each patterned area 341, 361 can extend in the X-direction (i.e., perpendicular to the edges 341R, 361L) while the rows can be spaced apart from each other in the Y-direction.

The positioning of transparent cells in the patterned area 341 are arranged in a staggered pattern with respect to the right edge 341R of the patterned area 341. Similarly, the positioning of transparent cells in the patterned areas 361 are each arranged in a staggered pattern with respect to the left edge 361L of the patterned area 361. These two staggered patterns can be used to vary the position in the X-direction for different locations in the Y-direction (i.e., for different rows of transparent cells) that correspond to the transition between radiation applied through the first mask 340 and the second mask 360. This staggered arrangement can be used to have the position of non-uniformities for the patterned features formed on the substrate 300 (e.g., a patterned feature having a different width and/or depth than intended) resulting from the transition of the radiation applied using the two different masks 340, 360 to also be staggered in the X-direction. By staggering the position of these non-uniformities, the effect of these non-uniformities on device performance (e.g., optical performance of a waveguide combiner) can be reduced as non-uniformities arranged on a single line have been found to have a greater effect on device performance (e.g., optical performance).

FIG. 3D shows the portions of the patterned areas 341, 361 from FIG. 3C overlaid on top of each other to form a combined patterned area 381. The combined patterned area 381 can include transparent portions 387 that are formed partially from transparent portions 347 from the first mask 340 and partially from transparent portions 367 from the second mask 360. The combined patterned area 381 can further include non-transparent portions 388. During processing, the masks 340, 360 can be positioned, so that the transparent portions 347, 367 are used to apply radiation to bordering regions of the substrate 300, but not used to apply radiation to a same location on the substrate. Thus, the masks are positioned over the substrate 300, so that the combined pattern area 381 functions as if only one large mask were positioned over the substrate 300 instead of the two masks 340, 360. For example, the combined patterned area 381 includes a plurality of rows (e.g., six rows in FIG. 3D) in which a transparent cell from the first staggered pattern of cells in the patterned area 341 borders a transparent cell from the second staggered pattern of cells in the patterned area 361 without any overlap of transparent cells from the two patterned areas 341, 361.

In some embodiments, a distance from the corresponding edge 341R, 361L to the first transparent cell varies for each neighboring row of transparent cells. In some embodiments, two or more neighboring rows of transparent cells can have a same distance to the corresponding edge 341R, 361L. In some embodiments, although not required, the edges 341R, 361L can each consist of a single straight line.

Figures 3E, 3F, 3G, 3H:
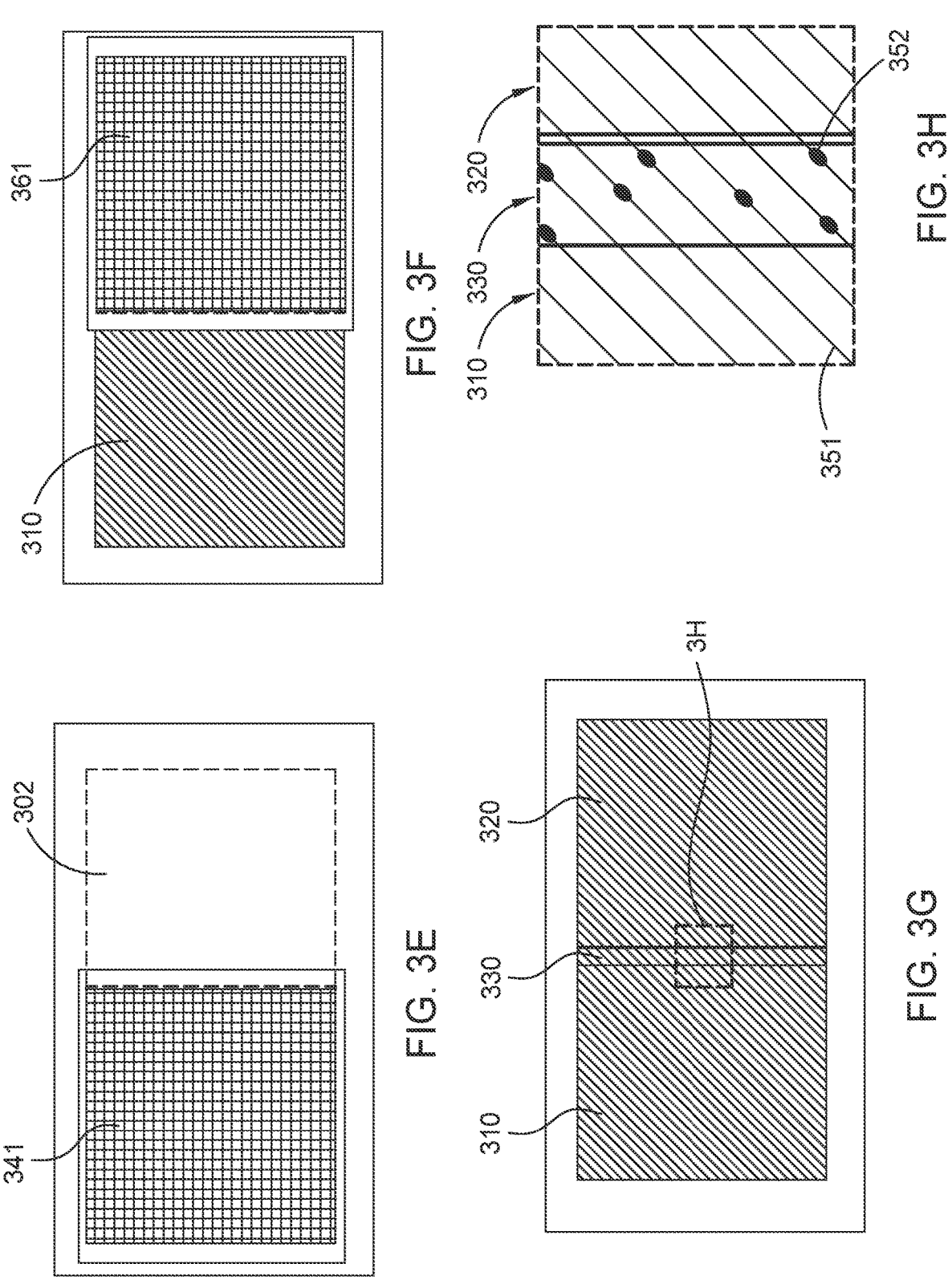
FIGS. 3E-3H show the substrate and masks from FIG. 3A during different portions of the method shown in FIG. 4 for forming the patterned features on the substrate.
Figure 4:
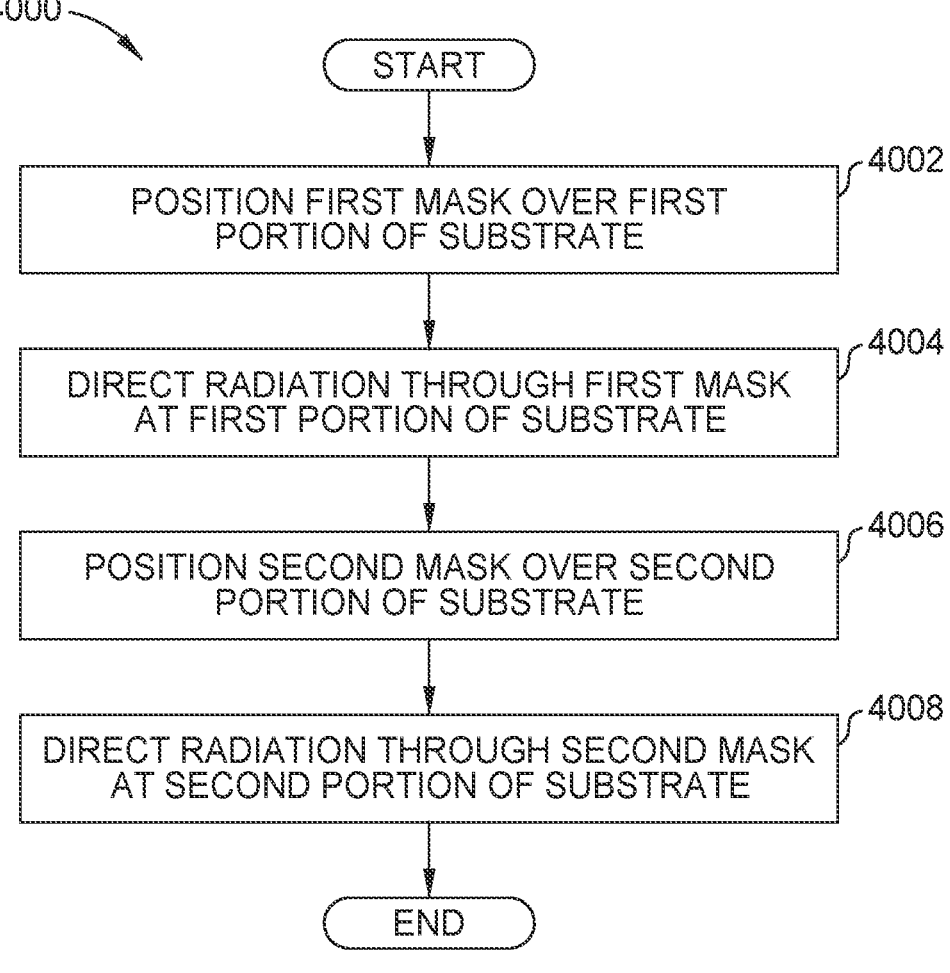
FIG. 4 is a process flow diagram of a method for forming patterned features on the substrate using the masks, according to one embodiment.

FIG. 4 is a process flow diagram of a method 4000 for forming patterned features on the substrate 300 using the masks 340, 360, according to one embodiment. FIGS. 3E-3H show the substrate 300 and masks 340, 360 during different portions of the method 4000 for forming the patterned features on the substrate 300. The method 4000 is described with reference to FIGS. 3A-3H and FIG. 4. The method 4000 begins at block 4002.

At block 4002, the first mask 340 that includes the patterned area 341 is positioned over the first portion 301 of the substrate 300 as shown in FIG. 3E.

At block 4004, during a first time period, radiation is directed through the patterned area 341 of the first mask 340 at the first portion 301 of the substrate 300 to form a first patterned region 310 (see FIG. 3F) on the substrate 300. The radiation directed at block 4004 also forms part of an overlap region 330 as described in more detail below.

At block 4006, with reference to FIG. 3F, the patterned area 361 of the second mask 360 is positioned over the second portion 302 of the substrate 300.

At block 4008, radiation is directed through the patterned area 361 of the second mask 360 at the second portion 302 of the substrate 300 to form a second patterned region 320 (see FIG. 3G) on the substrate 300 during a second time period. The radiation directed at block 4008 also forms part of the overlap region 330. The overlap region 330 is a region of the substrate that is exposed to radiation applied using the first mask 340 and to radiation applied using the second mask 360 in a staggered manner that matches the patterns described in reference to FIGS. 3C and 3D. Although the overlap region 330 is formed using radiation applied using the first mask 340 and the second mask 360, the radiation is staggered so that no individual portion of the substrate 300 (e.g., a portion of photoresist disposed on the substrate) receives radiation directed through both of the masks 340, 360 (e.g., none of the photoresist is exposed to radiation twice).

FIG. 3H is a close-up view of section 3H in FIG. 3G. FIG. 3H includes a portion of each of the regions 310, 320, 330. As described above, the first patterned region 310 is formed using only the first mask 340, and the second patterned region 320 is formed using only the second mask 360. On the other hand, the overlap region 330 is formed using the first mask 340 and the second mask 360. Non-uniformities often occur when at the portions of the substrate that correspond to a transition between masks. In FIG. 3H, non-uniformities 352 are shown as portions of patterned features 351 that are wider than other portions of the patterned features 351. In other embodiments, the non-uniformities can be narrower portions or portions having a different depth. Although efforts are made to completely remove non-uniformities, such as the non-uniformities 352, these non-uniformities remain a problem. When non-uniformities cannot be completely removed, the method 4000 described above offers an improvement by staggering the position of the non-uniformities. By staggering the position of the non-uniformities as described above, the effect on device performance (e.g., the effect on optical performance of a waveguide combiner) can be reduced when compared to the effect these non-uniformities would have if the non-uniformities were aligned a straight line, for example with the Y-axis.

While the foregoing is directed to embodiments of the present disclosure, other and further embodiments of the disclosure may be devised without departing from the basic scope thereof, and the scope thereof is determined by the claims that follow.

The invention claimed is:

1. A method of forming patterned features on a substrate comprising:

positioning a first mask over a first portion of a substrate, the first mask including a patterned area;

directing radiation through the patterned area of the first mask at the first portion of the substrate to form a first patterned region on the substrate during a first time period;

positioning a second mask over a second portion of the substrate, the second mask including a first patterned area and a second patterned area, the first patterned area spaced apart from the second patterned area by an unpatterned area;

directing radiation through the first patterned area of the second mask at a first part of the second portion of the substrate to form a second patterned region on the substrate during a second time period; and directing radiation through the second patterned area of the second mask at a second part of the second portion of the substrate to form a third patterned region on the substrate during a third time period, wherein the third patterned region is positioned between the first patterned region and the second patterned region.

2. The method of claim 1, wherein the third patterned region borders the first patterned region.

3. The method of claim 2, wherein the third patterned region borders the second patterned region.

4. The method of claim 1, wherein a size of the third patterned region is less than 10% of a size of the second patterned region.

5. The method of claim 4, wherein the size of the third patterned region is less than 10% of a size of the first patterned region.

6. The method of claim 1, wherein a size of the third patterned region is less than 1% of a size of the second patterned region.

7. The method of claim 6, the size of the third patterned region is less than 1% of a size of the first patterned region.

8. The method of claim 1, wherein the third time period occurs after the first time period and the second time period.

9. The method of claim 1, wherein the third time period occurs before the first time period and the second time period.

10. The method of claim 1, wherein the third time period occurs between the first time period and the second time period.

11. A method of forming patterned features on a substrate comprising:

positioning a first mask over a first portion of a substrate during a first time period;

directing radiation through a patterned area of the first mask at the first portion of the substrate during the first time period to form a first patterned region on the substrate, wherein for the first mask the patterned area of the first mask includes a first edge, the patterned area of the first mask includes a plurality of transparent cells and non-transparent cells arranged in rows that extend perpendicular to the first edge and columns that extend parallel to the first edge, each transparent cell having a first side, the first edge of the patterned area is parallel to the first side of each of the transparent cells, and the positions of the transparent cells are arranged in a first staggered pattern in which the position of transparent cells are staggered for the different rows with respect to the first edge;

positioning a second mask over a second portion of the substrate during a second time period; and directing radiation through a patterned area of the second mask at the second portion of the substrate during the second time period to form a second patterned region on the substrate, wherein for the second mask the patterned area of the second mask includes a first edge, the patterned area of the second mask includes a plurality of transparent cells and non-transparent cells arranged in rows perpendicular to the first edge and columns parallel to the first edge, each transparent cell having a first side, the first edge of the patterned area is parallel to the first side of each of the transparent cells, and the positions of the transparent cells are arranged in a second staggered pattern in which the position of transparent cells are staggered for the different rows with respect to the first edge.

12. The method of claim 11, wherein the first staggered pattern is configured to be combined with the second staggered pattern to form a combined pattern, the combined pattern including a plurality of rows in which a transparent cell from the first staggered pattern borders a transparent cell from the second staggered pattern.

13. The method of claim 12, wherein there is no overlap of transparent cells from the first staggered pattern and the second staggered pattern in the combined pattern.

14. The method of claim 11, wherein a distance from the first edge to a first transparent cell changes for each bordering row in the first staggered pattern.

15. The method of claim 11, wherein the first edge of the patterned area of the first mask consists of a single straight line.

16. The method of claim 15, wherein the first edge of the patterned area of the second mask consists of a single straight line.

17. A method of forming patterned features on a substrate comprising:

positioning a first mask over a first portion of a substrate, the first mask including a patterned area, directing radiation through the patterned area of the first mask at the first portion of the substrate to form a first patterned region on the substrate during a first time period;

positioning a second mask over a second portion of the substrate, the second mask including a first patterned area and a second patterned area, the first patterned area spaced apart from the second patterned area by an unpatterned area;

directing radiation through the first patterned area of the second mask at a first part of the second portion of the substrate to form a second patterned region on the substrate during a second time period; and directing radiation through the second patterned area of the second mask at a second part of the second portion of the substrate to form a third patterned region on the substrate during a third time period, wherein the third patterned region is positioned between the first patterned region and the second patterned region, a size of the third patterned region is less than 1% of a size of the second patterned region, the third patterned region borders the first patterned region, and the third patterned region borders the second patterned region.

18. The method of claim 17, wherein the size of the third patterned region is less than 0.1% of the size of the second patterned region.

19. The method of claim 17, wherein the third patterned region includes a first edge, the second patterned region includes a first edge, and a length of the first edge of the third patterned region is the same as a length of the first edge of the second patterned region.

20. The method of claim 19, wherein the first patterned region includes a first edge, and the length of the first edge of the third patterned region is the same as a length of the first edge of the first patterned region.

* * * * *